(12) United States Patent
Velichko et al.

(10) Patent No.: US 7,833,819 B2
(45) Date of Patent: Nov. 16, 2010

(54) METHOD AND APPARATUS FOR DECREASING STORAGE NODE PARASITIC CHARGE IN ACTIVE PIXEL IMAGE SENSORS

(75) Inventors: Sergey Velichko, Boise, ID (US); Hong-Wei Lee, San Jose, CA (US)

(73) Assignee: Aptina Imaging Corporation, Geroge Town (KY)

( * ) Notice: Subject to any disclaimer, the term of this patent is extended or adjusted under 35 U.S.C. 154(b) by 245 days.

(21) Appl. No.: 12/178,374

(22) Filed: Jul. 23, 2008

(65) Prior Publication Data

US 2010/0019294 A1    Jan. 28, 2010

(51) Int. Cl.
    *H01L 21/00* (2006.01)
(52) U.S. Cl. .............. 438/79; 257/E21.631
(58) Field of Classification Search ............... 257/226, 257/227, 229, 230, 239, 290–294, 432, 436, 257/E31.073, E31.075, E31.081, E21.617, 257/E21.631; 438/69, 70, 73, 76, 78, 79, 438/519, 527
See application file for complete search history.

(56) References Cited

U.S. PATENT DOCUMENTS

| | | | |
|---|---|---|---|
| 6,307,195 B1 | 10/2001 | Guidash | |
| 6,498,622 B1 | 12/2002 | Nakashiba | |
| 7,015,521 B2 * | 3/2006 | Koyama | 257/292 |
| 7,110,028 B1 * | 9/2006 | Merrill | 348/294 |
| 7,115,924 B1 | 10/2006 | LaMaster et al. | |
| 7,119,387 B2 * | 10/2006 | Ohkawa | 257/292 |
| 7,271,430 B2 * | 9/2007 | Park et al. | 257/225 |
| 2002/0020863 A1 | 2/2002 | Lee | |
| 2003/0173603 A1 | 9/2003 | Shim | |
| 2004/0140491 A1 | 7/2004 | Rhodes | |
| 2005/0012527 A1 | 1/2005 | Hynecek | |
| 2005/0116250 A1 * | 6/2005 | Mizuguchi | 257/140 |
| 2005/0133825 A1 * | 6/2005 | Rhodes et al. | 257/204 |
| 2005/0145905 A1 * | 7/2005 | Iwata | 257/292 |
| 2005/0157194 A1 | 7/2005 | Altice | |
| 2005/0161713 A1 | 7/2005 | Rhodes | |
| 2005/0184322 A1 | 8/2005 | Inoue | |
| 2005/0274874 A1 | 12/2005 | Nozaki | |

(Continued)

FOREIGN PATENT DOCUMENTS

JP    2006-245540    9/2006

(Continued)

OTHER PUBLICATIONS

Mabuchi et al., "CMOS image sensors comprised of floating diffusion driving pixels with buried photodiode", Solid-State Circuits IEEE Journal of, pp. 2408-2416, Issue Date: Dec. 2004, vol. 39 Issue:12.

(Continued)

*Primary Examiner*—Matthew C Landau
*Assistant Examiner*—Joseph C Nicely
(74) *Attorney, Agent, or Firm*—David C. Kellogg

(57) ABSTRACT

Methods, systems and apparatuses for an imager that improve the quality of a captured image. The imager includes a pixel having a photosensor that generates charge in response to receiving electromagnetic radiation and a storage region that stores the generated charge. A protection region assists in keeping undesirable charge from reaching the storage region.

5 Claims, 20 Drawing Sheets

U.S. PATENT DOCUMENTS

| | | |
|---|---|---|
| 2006/0086955 A1* | 4/2006 | Iwata ................. 257/226 |
| 2006/0181622 A1 | 8/2006 | Hong |
| 2006/0208289 A1 | 9/2006 | Ohkawa |
| 2006/0214201 A1 | 9/2006 | Rhodes |
| 2006/0278896 A1 | 12/2006 | Inoue |
| 2006/0284054 A1 | 12/2006 | Asaba |
| 2007/0034939 A1 | 2/2007 | Lee |
| 2007/0075338 A1* | 4/2007 | Park et al. .............. 257/222 |
| 2007/0085110 A1 | 4/2007 | Okita |
| 2007/0114629 A1 | 5/2007 | Dosluoglu |
| 2008/0135896 A1 | 6/2008 | Fan et al. |
| 2009/0160987 A1* | 6/2009 | Bechtel et al. ............. 348/302 |
| 2010/0117123 A1* | 5/2010 | Rhodes et al. ............. 257/227 |

FOREIGN PATENT DOCUMENTS

| | | |
|---|---|---|
| JP | 2006-352070 | 12/2006 |
| KR | 2002-0057282 | 7/2002 |
| KR | 2003-0057710 | 7/2003 |
| KR | 2004-0023226 | 3/2004 |
| KR | 2004-0058686 | 7/2004 |
| KR | 2004-0065332 | 7/2004 |
| KR | 2004-0093997 | 11/2004 |

OTHER PUBLICATIONS

Yonemoto et al., "A CMOS image sensor with a simple FPN-reduction technology and a hole accumulated diode", Solid-State Circuits Conference, 2000. Digest of Technical Papers. ISSCC. 2000 IEEE International, pp. 102-103, Issue Date: 2000.

Mabuchi et al., "CMOS Image Sensor Using a Floating Diffusion Driving Buried Photodiode", Solid-State Circuits Conference, 2004. Digest of Technical Papers. ISSCC. 2004 IEEE International, pp. 112-516 vol. 1, Issue Date: Feb. 15-19, 2004.

Wong, "CMOS image sensors-recent advances and device scaling considerations", Electron Devices Meeting, 1997. IEDM '97. Technical Digest., International, pp. 201-204, Issue Date: Dec. 7-10, 1997.

Pain et al., "CMOS imager with charge-leakage compensated frame difference and sum output", Circuits and Systems, 2001. ISCAS 2001. The 2001 IEEE International Symposium on, pp. 223-226 vol. 5, Issue Date: 2001 vol. 5.

Sugawa et al., "A 100dB Dynamic Range CMOS Image Sensor Using a Lateral Overflow Integration Capacitor", IEEE International Solid-State Circuits Conference, pp. 352, 353, and 603, 2005.

* cited by examiner

METHOD AND APPARATUS FOR DECREASING STORAGE NODE PARASITIC CHARGE IN ACTIVE PIXEL IMAGE SENSORS

FIELD OF THE INVENTION

Embodiments of the present invention generally relate to electronic image devices and, more specifically, to improving the quality of images captured by the imager in such devices.

BRIEF DESCRIPTION OF RELATED ART

The use of image devices has rapidly expanded from basic image capture to decision type applications such as collision avoidance and object recognition. These and other types of applications require fast and accurate capture of an image.

In general, an image device includes an imager having an array of sensors (pixels) that each generate and store an electrical signal in response to receiving electromagnetic radiation. There are a number of different types of semiconductor-based imagers, such as charge coupled devices (CCDs), photodiode arrays, charge injection devices CIDs), hybrid focal plane arrays, and Complementary Metal Oxide Semiconductor (CMOS) imagers. Examples of CMOS imagers are described in U.S. Pat. Nos. 6,140,630, 6,376,868, 6,310,366, 6,326,652, 6,204,524, and 6,333,205, each of which is assigned to Micron Technology, Inc.

Various types of interference can introduce errors during the capture of electromagnetic radiation by the imager. One such type of interference is diffused or stray electrons being collected by the circuitry responsible for storing a pixel generated charge. This type of interference can result in image shading and smear.

It would be a distinct advantage to have an electronic device with an imager that was less susceptible to this type of interference.

DETAILED DESCRIPTION

The present invention is explained below in connection with various embodiments such as an electronic image capture device. These embodiments are solely for the purpose of providing a convenient and enabling discussion of the general applicability of the present invention, and are not intended to limit the various additional embodiments or applications to which the present invention can be applied as defined in the claims and their equivalents.

The term "substrate", as used below, includes but is not limited to any supporting structure including, but not limited to, a semiconductor substrate having a surface on which devices can be fabricated. A semiconductor substrate can include silicon, Silicon-On-Insulator (SOI), Silicon-On-Sapphire (SOS), doped and un-doped semiconductors, epitaxial layers of silicon supported by a base semiconductor foundation, and other semiconductor structures, including those made of semiconductors other than silicon.

The term "pixel", as used below, includes but is not limited to a photo-element having a photosensor that converts electromagnetic radiation, such as photons, into electrons.

The various embodiments described below illustrate the use and formation of a protection region that can limit the influence of diffused or stray electrons on the storage region of a pixel such as a floating diffusion region.

Figure 1:
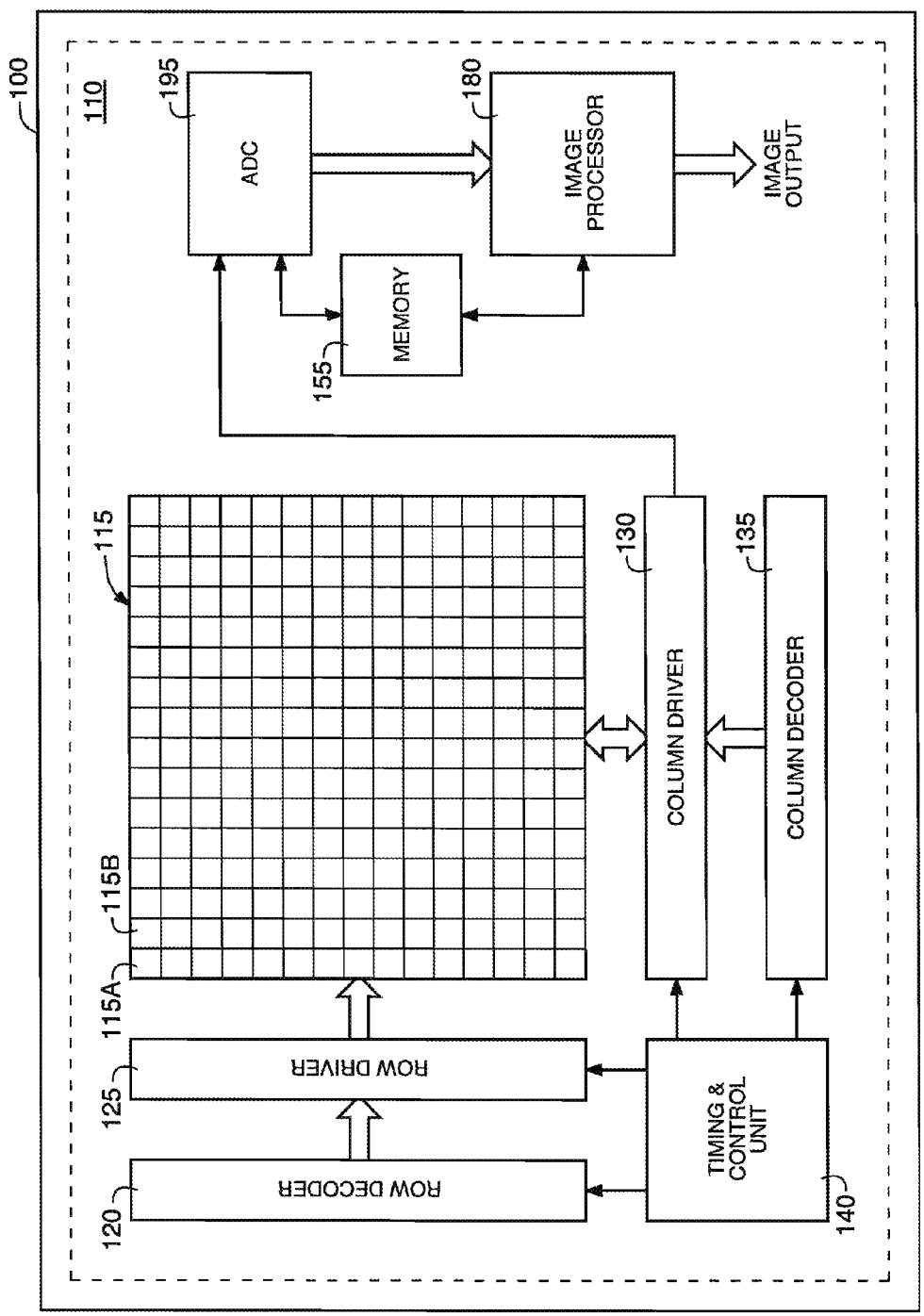
FIG. 1 is a block diagram illustrating an embodiment of the present invention as a image capture device having an imager.

FIG. 1 is a block diagram of an embodiment showing an image capture device 100 having an imager 110. Image capture device 100 can be any electronic device that captures an image such as a camera, video recorder, security camera, object recognition device, or cell phone. The use, implementation, and interaction of such electronic devices 100 with an imager, such as imager 110, are well known and understood in the relevant art. Consequently, these types of details are limited in their discussion below in order to not obscure the described embodiment.

Imager 110 includes a pixel array 115 and support circuitry (e.g., timing and control unit 140) for accessing and interpreting image data from the pixel array. The arrangement, number, and functionality of the support circuitry can vary from one imager 110 to another. Consequently, the illustrated embodiment is merely a representation of an imager that assists in the description of the present invention and should not be taken as a limitation on the various possible other embodiments.

Pixel array 115 is represented as having individual pixels arranged in columns and rows. Each of these individual pixels can be accessed using a row and column address in a fashion similar to that used for memory.

A timing and control unit 140 can coordinate the capture and retrieval of image data using an address that can be decoded by both a column decoder 135 and row decoder 120 to indicate a row and the columns of the pixels 115 residing in the indicated row.

A row driver 125 can select an indicated row for the capture and retrieval of the image data. A column driver 130 can retrieve the stored image data for each of the pixels 115 contained in the selected row and provide sampled signals to the Analog to Digital Converter (ADC) 195 for conversion to a digital signal. The digital signal from the ADC 195 can be provided to an image processor 180 (internal or external) for further processing.

Pixel cells 115A-B are representative of the pixel cells residing in pixel array 115 and are explained in greater detail in connection with FIGS. 2-3 below.

Figure 2:
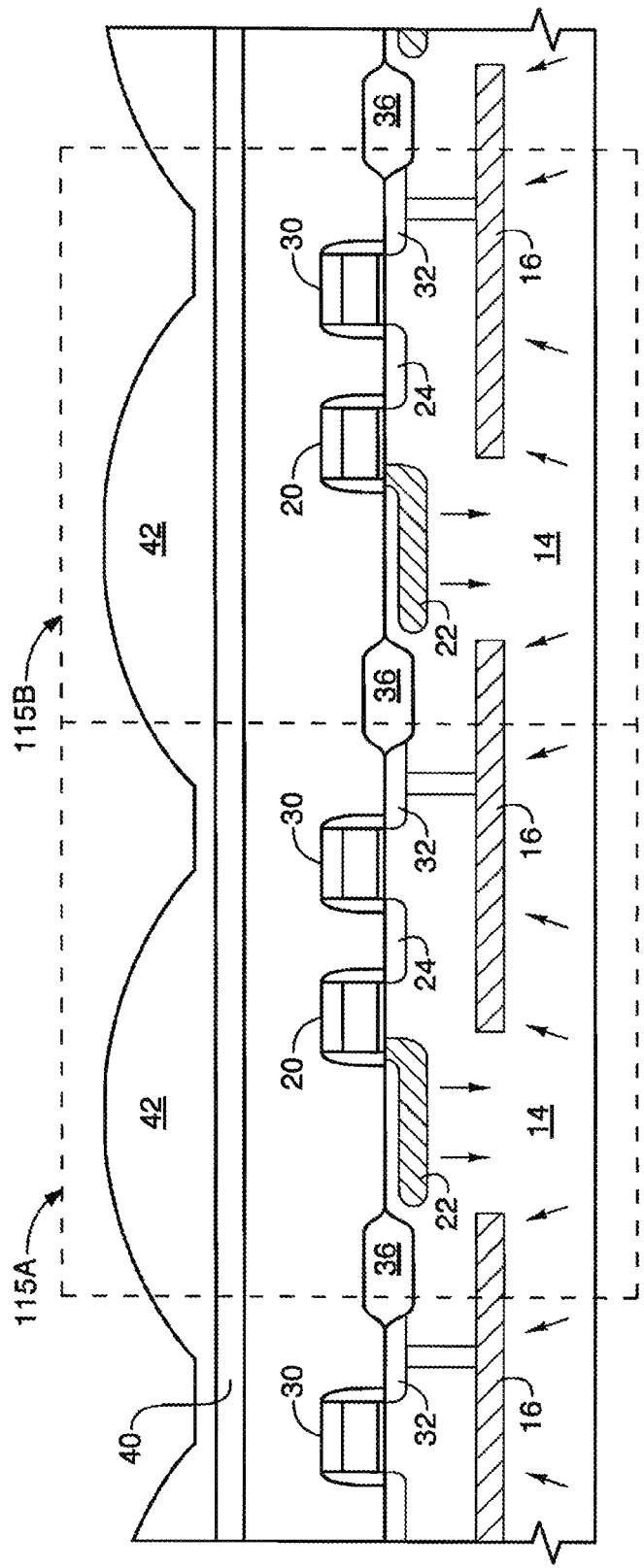
FIG. 2 is a cross-sectional view of an embodiment illustrating a selected number of pixel cells from FIG. 1.

FIG. 2 shows a cross-sectional view of an embodiment of the pixel cells 115A-B of FIG. 1. Each pixel cell 115A-B can be formed in association with a substrate 14 of any known semiconductor supporting structure. For example, substrate 14 can be formed as, a p+ type substrate that can also have one or more optional p-epitaxial layers (not shown), a p− type substrate (no epitaxial layer), or an n− type substrate. In the current embodiment, substrate 14 is formed as a p− type substrate.

Each pixel cell 115A-B can include a micro-lens 42 to assist in directing electromagnetic radiation (e.g., light) towards a photosensor 22 that generates charge (e.g., electrons in a p– type substrate, holes in an n– type substrate) in response to receiving the light.

Depending upon the particular design of imager 110, each pixel 115A-B can include a single photosensor 22 (as shown) or multiple (e.g., at various depths). In addition, the color or wavelength of light reaching the photosensor 22 can be unfiltered (infra-red) or filtered for specific wavelengths of light (e.g., red, blue, green, ultra-violet, etc.). In the current embodiment, each photosensor 22 receives a specific wavelength of light as filtered from color filter 40 located below the micro-lens 42.

Each pixel cell 115A-B can also include a transfer transistor 20 and a reset transistor 30. The transfer transistor 20 is located next to photosensor 22 and transfers the generated charge from the photosensor 22 to a storage region such as floating diffusion region 24 upon receiving a transfer control signal. Reset transistor 30 can be located next to the floating diffusion region 24, coupled to a voltage source (e.g., VaaPix), and can reset the floating diffusion region 24, and optionally the photosensor 22, upon receiving a reset control signal.

One or more isolation regions 36 can be used to isolate at least a portion of a pixel 115A-B from an adjacent pixel 115A-B.

Solid arrows are shown for illustrating stray electrons that can be present in the substrate 14. Stray electrons can be created from multiple sources such as when photons strike the photosensor 22 and penetrate into the substrate 14. These stray electrons can be collected by the floating diffusion region 24 and introduce errors into any stored or to be stored charges.

In one embodiment, a region, such as protection region 16, is used to assist in reducing the ability of stray electrons to reach the floating diffusion region 24. The protection region 16 can be located below a portion or the entirety of the floating diffusion region 24, and can also extend laterally and below the transfer gate 20. The protection region 16 can also be spaced from the floating diffusion region 24 by a region of different conductivity type. For example, the protection region 16 can be located about 1 μm to about 4 μm, or about 2 μm to 2.5 um, under the upper surface of the substrate 14, so that a portion of the substrate 14 is located between the floating diffusion region 20 and the protection region 16. The protection region 16 is capable of attracting stray electrons that could interfere with the floating diffusion region 24 or travel to an adjacent pixel as explained in connection with FIG. 3 below.

Figure 3:
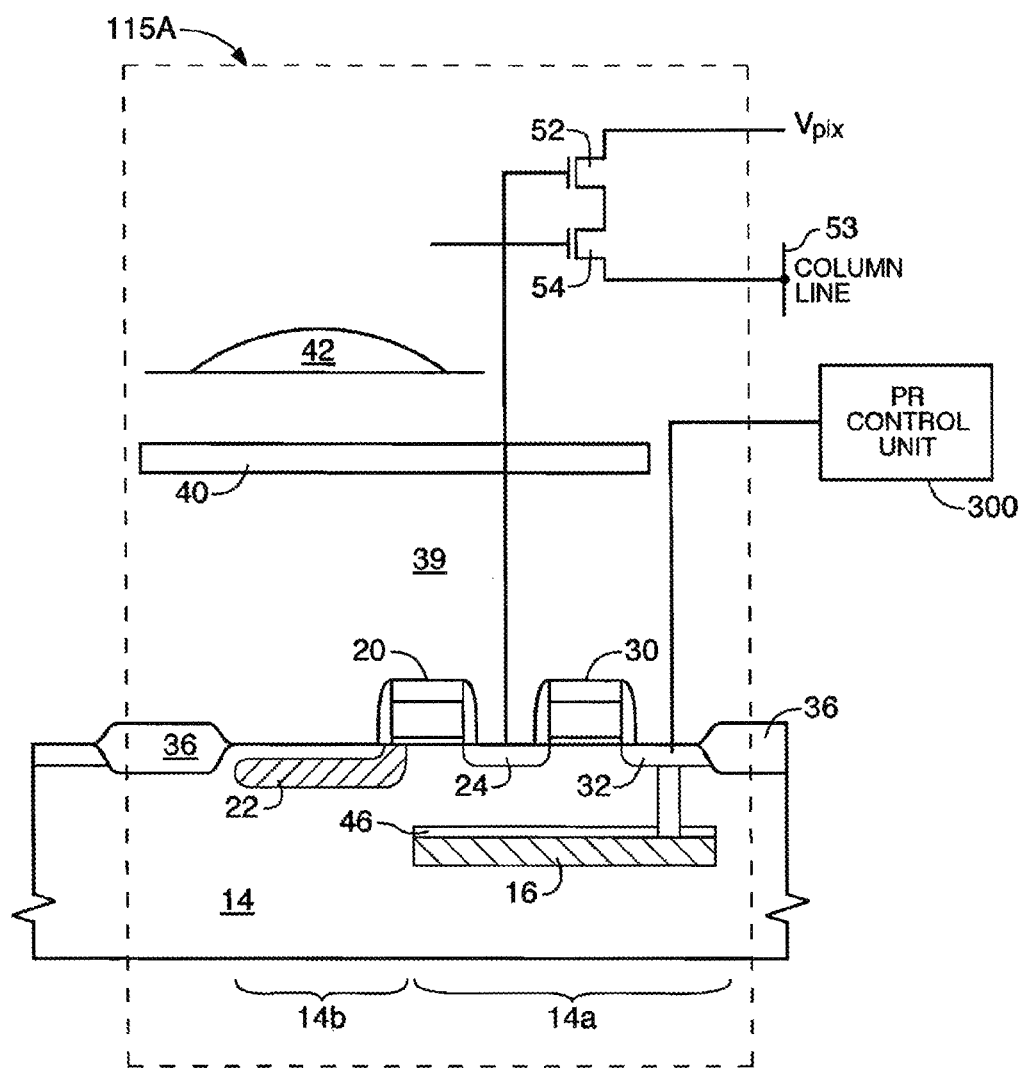
FIG. 3 is a cross-sectional view of one of the pixel cells of FIG. 2.

As shown schematically in FIG. 3, pixel 115A includes a source follower transistor 52, having a gate connected to the floating diffusion region 24 to receive and amplify the charge signal, and a row select transistor 54 for selectively coupling the output of the source follower transistor 52 to a pixel array column line 53. The operation of the photosensor 22, the transfer transistor 20, the reset transistor 34, the source follower transistor 52, and the row select transistor 54 are well known and understood by those skilled in the art and are described in the previously mentioned U.S. Patents assigned to Micron Technology, Inc.

The protection region 16 can be coupled to a Protection Region (PR) control unit 300 that can control the voltage potential applied to the protection region 16 by applying a desired voltage level. In one embodiment, the protection region 16 and source 32 of the reset transistor 34 are coupled one to another and the PR control unit 300. In another embodiment (not shown), the protection region 16 and PR control unit 300 can be coupled together but separately from the source 32 of the reset transistor 34 (i.e. a separate conductor). In another embodiment, each row of the pixel array 115 shares a PR control unit 300. In yet another embodiment, each pixel 115A-B has a separate PR control unit 300. In the current embodiment, a single PR control unit 300 is used for the entire array 115 as illustrated in FIG. 3.

The potential of the protection region 16 can be varied according to an estimated amount of stray electrons to increase its effectiveness. In one embodiment, the integration time of the pixel 115A can be used as an accurate measure for estimating the amount of stray electrons and can be determined from a source such as, for example, the auto exposure control mechanism of a camera. In another embodiment, the amount of stray electrons can be estimated by classifying integration periods into two or more groups according to a predetermined range. For example, in one embodiment groups can be classified such as long, medium or short. In this embodiment, a long integration period could be considered about 33.3 milliseconds to about 10 seconds, medium about 1 millisecond to about 33.2 milliseconds, and short from about 0.01 microseconds to about 999 microseconds.

In this embodiment, a long integration period would result in applying a voltage level to the protection region 16 that is relatively close to the potential of the substrate 14. The low voltage level would substantially limit the stray electron collection capability of the protection region 16. A voltage level that is higher than that of the long integration period (e.g., half-way between substrate potential and VaaPix) can be used during medium integration periods. Short integration periods are especially susceptible to parasitic charge from stray electrons because the ratio of acquired photo charge to the parasitic charge of the storage region (e.g., floating diffusion region 24) is significantly lower when compared to longer integration times. Consequently, the voltage level applied to the protection region 16 during short integration periods can be greater than any other integration period (e.g., VaaPix).

The PR control unit 300 can also apply a voltage level such as VaaPix during the reset periods of the photosensor 22 and floating diffusion 24 to assist in the reset process.

Figure 4:
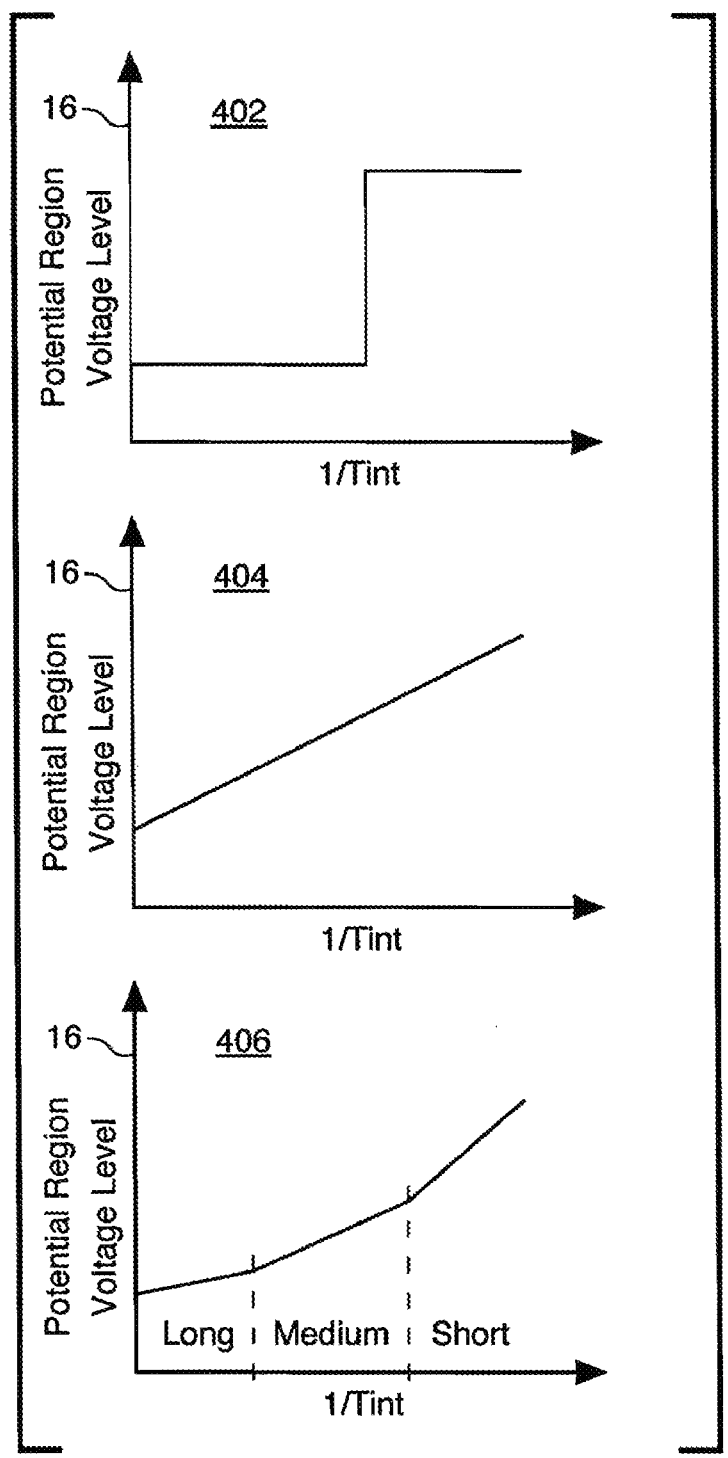
FIG. 4 is a diagram showing several embodiments for dynamically changing the voltage level applied to the protection region of FIG. 2.

In another embodiment, the voltage level applied to the protection region 16 can be dynamically altered according to the period of integration as explained in connection with FIG. 4 below.

In this embodiment, the PR control unit 300 can apply a voltage that is related to the inverse of the integration time for the pixel 115A. FIG. 4 illustrates several voltage diagrams 402-406 representing various embodiments where the PR control unit 300 can apply a voltage level that is related to the inverse of the integration time for the pixel 115A. In these diagrams 402-406, the voltage level applied to the protection region 16 is represented by the y-axis and the inverse of the integration time is represented by the x-axis. In one embodiment, the PR control unit 300 can apply a first voltage level (e.g., minimum) to the protection region 16 until a threshold is passed and then a second voltage level (e.g., maximum) can be applied as illustrated in voltage diagram 402.

In another embodiment, the PR control unit 300 can apply a voltage level that increases linearly with the inverse of the integration time as illustrated in voltage diagram 404. In yet another embodiment, the PR control unit 300 can apply a voltage level having a variable rate of change such as that previously discussed with long, medium, and short integration periods as illustrated in voltage diagram 406.

The ability to change the potential of the protection region 16 allows flexibility to compensate for process manufacturing variations such as physically locating the protection region 16 at a greater distance from the photodiode 22 and floating diffusion region 24 while maintaining the collection of stray electrons at an acceptable level. In addition, the potential of the protection region 16 can be customized for each imager to account for manufacturing related variations.

Altering the potential of the protection region 16 can also provide the ability to change the spectral response of a pixel 115A. Specifically, the depletion borders of the protection region 16 change according to the applied voltage level and can be extended (via increasing the voltage level) so as to reduce the exposure of the photodiode 22 to the substrate. This can reduce the photon-generated charges reaching the photodiode 22 from below, and consequently, less quantum efficiency to specific wavelengths such as red and near-infrared. This can provide the capability to eliminate the use of IR filters or alternatively the ability to use cheaper lower quality IR filters since the task is split between the low quality IR filter and protection region 16.

The location and size of the protection region 16 can vary from being located in segments below selected pixels to a continuous structure residing below all of the pixels. One example for using a non-continuous structure can be where the pixels are designated to capture of a particular wavelength of light (e.g., by a color filter). In this example, the concern for stray electrons may not be as great for each of the particular wavelengths. For example, blue and green wavelengths (e.g., 620 nm or less) may not penetrate as deep into the substrate 14 as red light wavelength.

Figure 5:
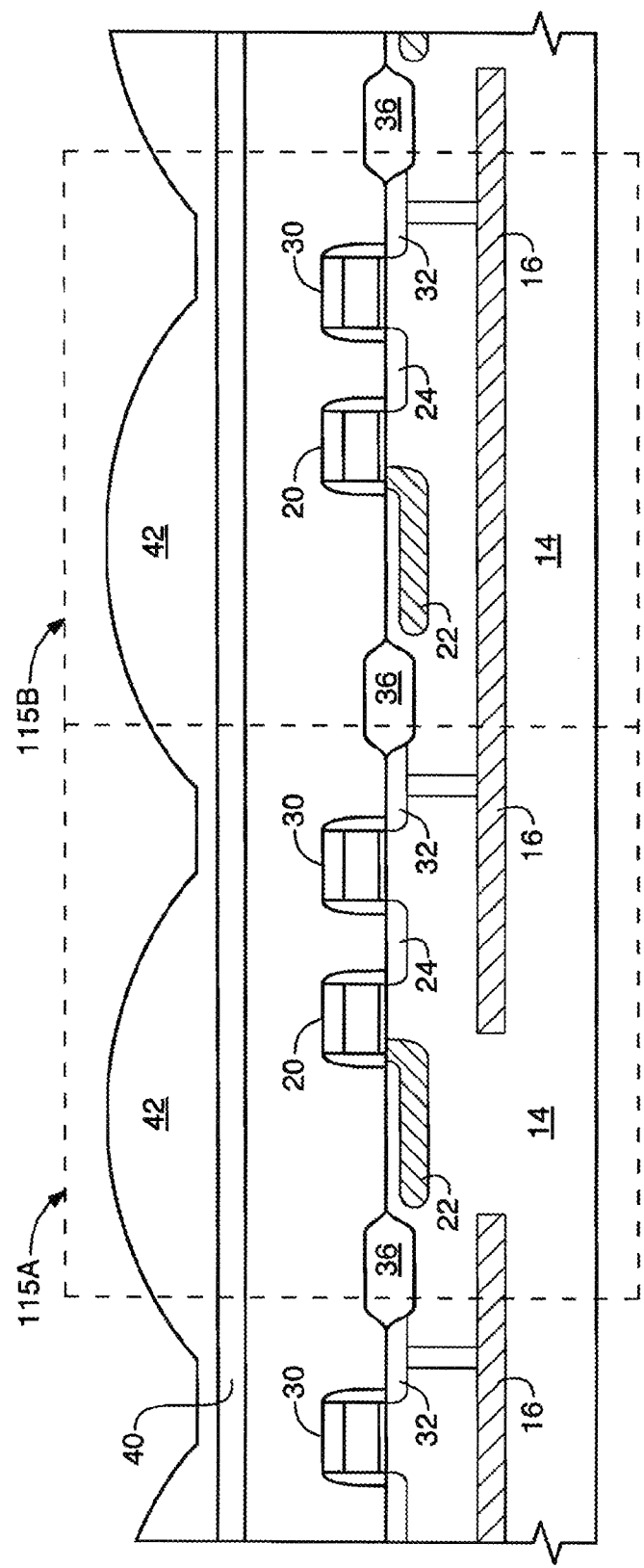
FIG. 5 is a diagram of an embodiment of the pixel cells of FIG. 2 configured to receive red and blue light.

FIG. 5 represents an embodiment where pixels 115A and 115B receive red and blue light, respectively. In this embodiment, protection region 16 extends below blue pixel 115B, but discontinues below a red pixel 115A.

Figure 8:
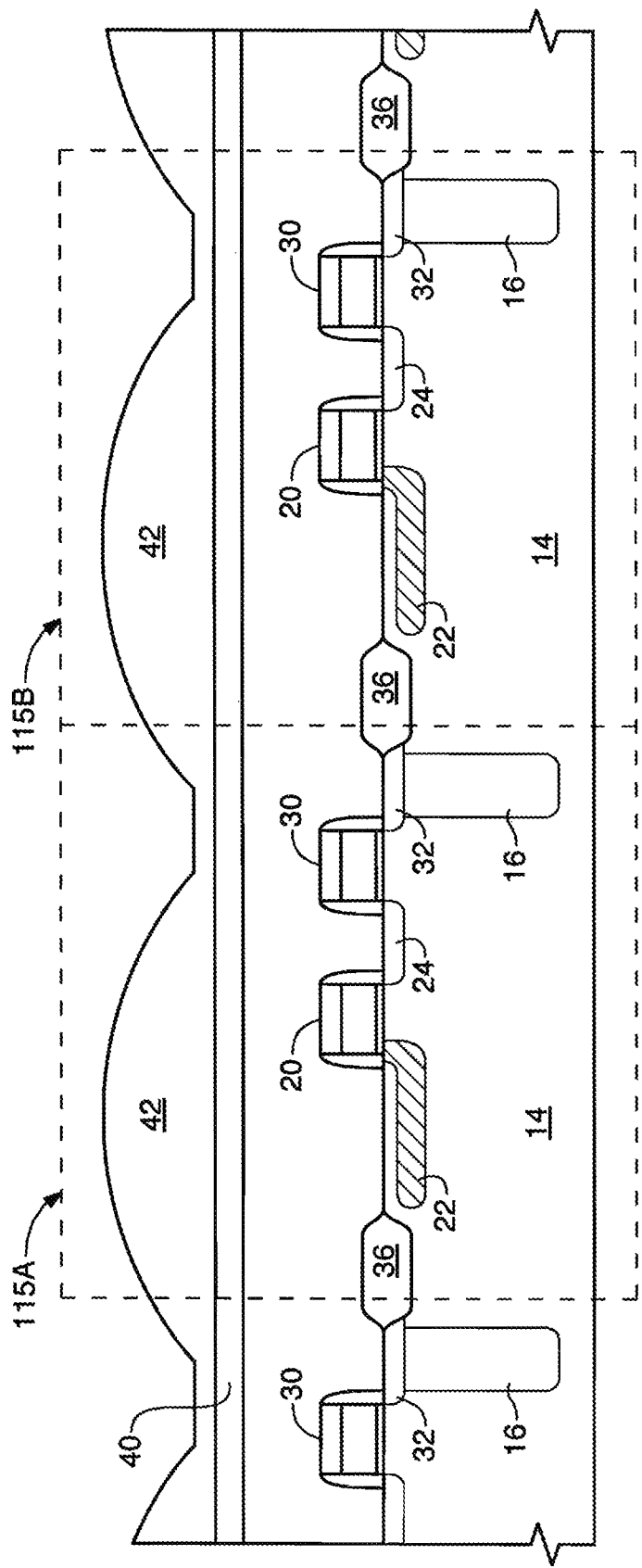
FIG. 8 is a diagram of an embodiment of selected pixel cells of FIG. 1 and a protection region.
Figure 9:
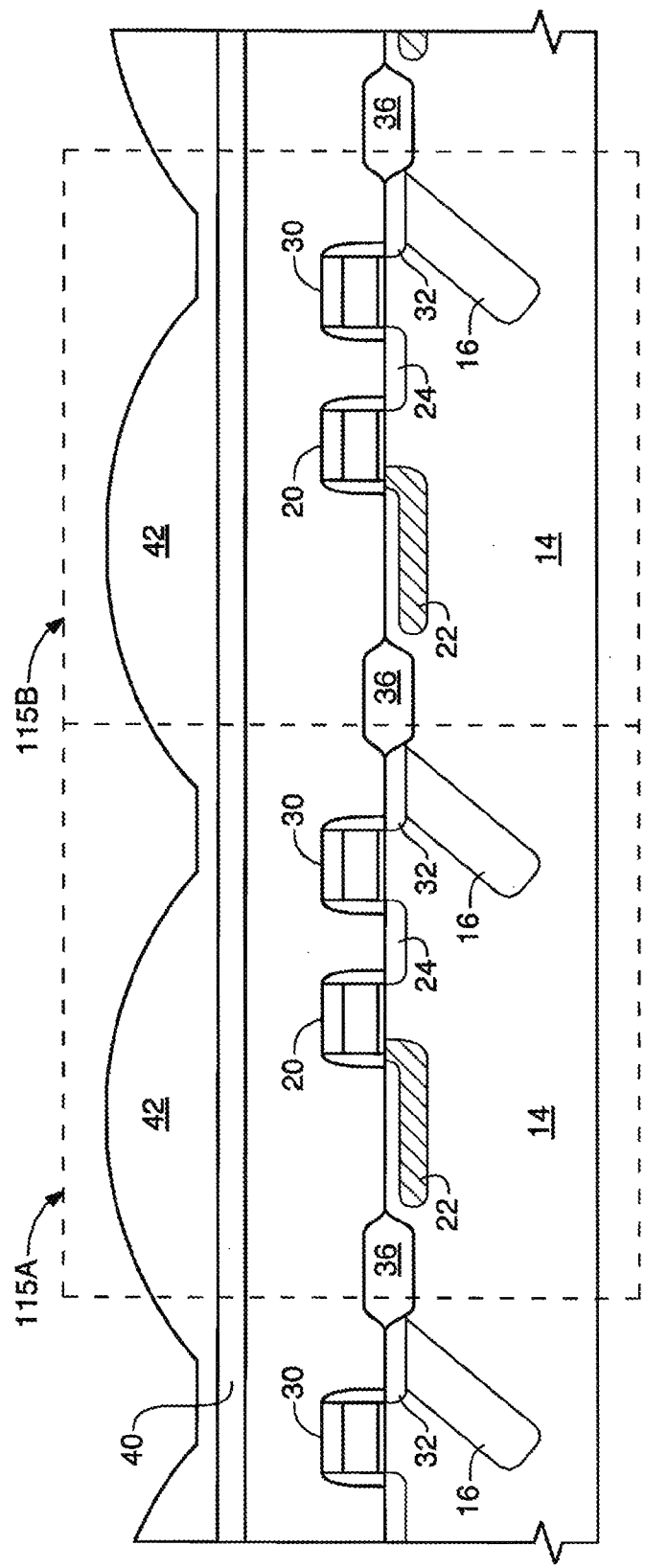
FIG. 9 is a diagram of an embodiment of selected pixel cells of FIG. 1 and an angled protection region.

Manufacturing requirements (e.g., small size pixels) can also limit the physical dimensions of the protection region 16 so that only partial coverage can be possible. Various alterations to the protection region 16 can be made to accommodate various manufacturing requirements or limitations. For example, in one embodiment, the protection region 16 can be implanted at an angle as illustrated in FIG. 9. Alternatively, whether from manufacturing or design requirements the protection region 16 can also extend in a vertical direction below the drain region 32 as illustrated in FIG. 8.

FIGS. 6A-F illustrates an embodiment for fabricating the protection region 16 previously described. It should be noted that the details and description associated with these figures are not limiting but are representative of an embodiment for accomplishing this fabrication.

Figure 6A:
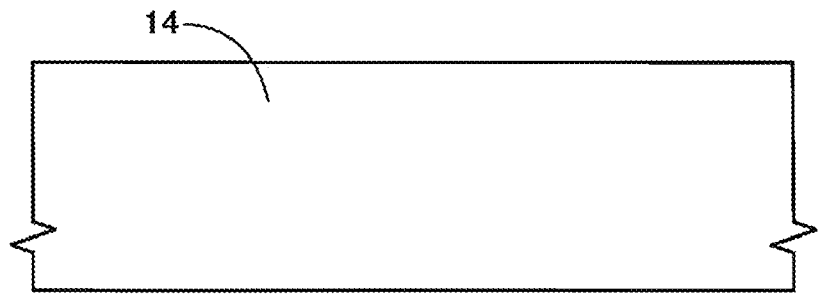
FIGS. 6A-K represents diagrams of an embodiment for the fabrication of a protection region.

The fabrication begins with a p+ substrate 14 as illustrated in FIG. 6A. It should be understood, however, that substrate 14 could also be formed from other materials or types such as a p− type substrate, in which case the process for forming the p-epitaxial section 614 discussed below can be omitted.

Figure 6B:
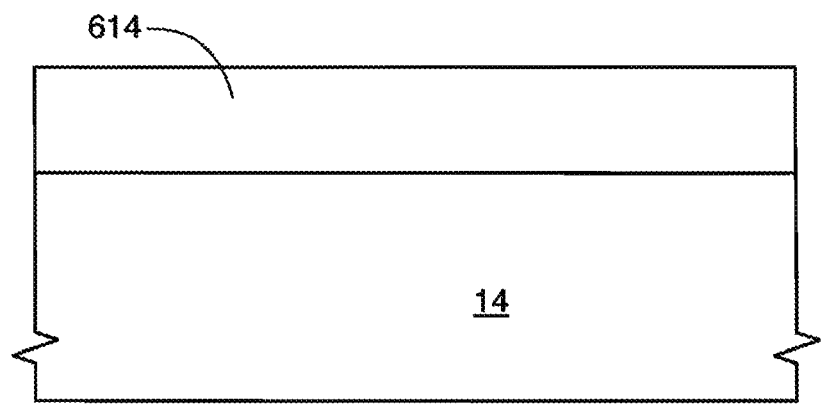

A p-epitaxial section 614 is grown over the substrate 14 as illustrated in FIG. 6B. The p-epitaxial section 614 can be formed from known materials, such as, for example, silicon tetrachloride or silane. In the present example, the p-epitaxial section 114 is grown with any method for growing single-crystal silicon (i.e., silane). The thickness of the p-epitaxial section 614 can be about 0.05 μm, 0.5 μm, or more. In one embodiment, the p-epitaxial section 614 can have a thickness in the range of about 2 μm to about 4 μm.

Figure 6C:
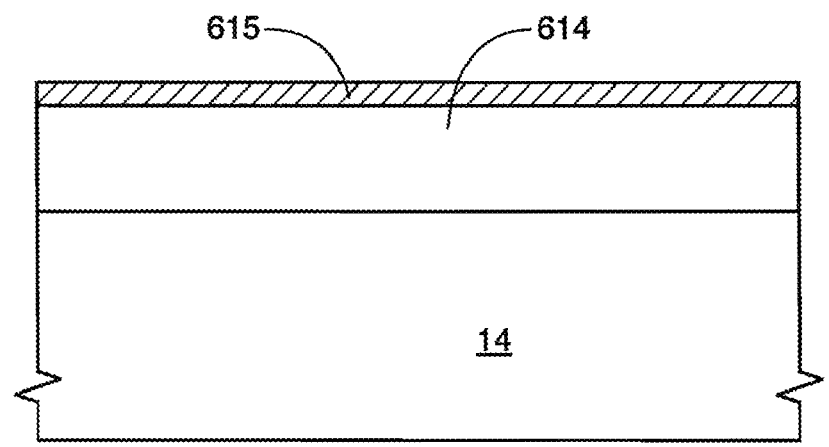

An oxide section 615 is deposited over the p-epitaxial section 614 as illustrated in FIG. 6C. The deposition can be accomplished using any method such as, for example, chemical vapor deposition or thermal oxidation. In one example, the oxide section 615 is formed with thermal oxidation by exposing the surface of the p-epitaxial section 614 in an oxygen atmosphere at an elevated temperature. The oxide section 615 can be formed from any suitable material that prevents photoresist contamination of the wafer such as nitride. The oxide section 615 can have a thickness in the range of about 20 angstroms to about 500 angstroms.

Figure 6D:
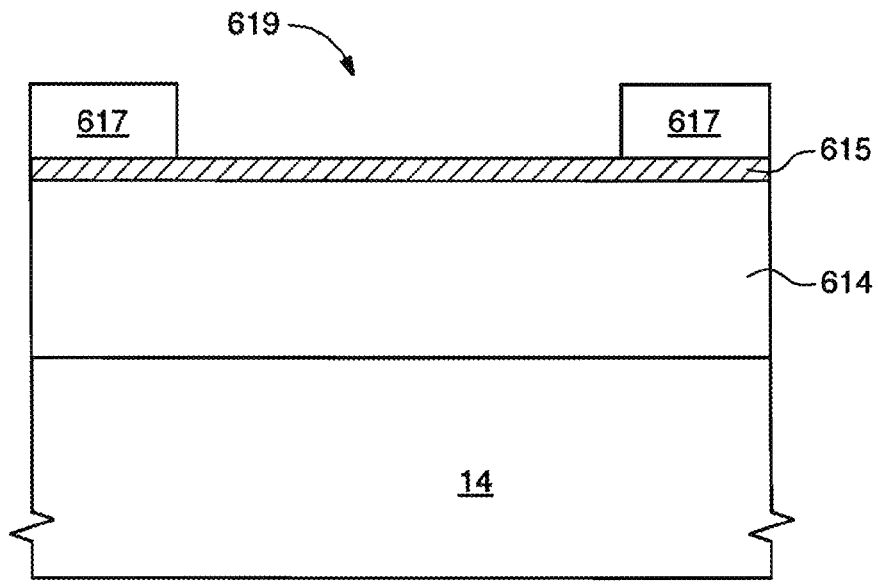

A patterned photoresist section 617 is formed over the oxide section 615 as illustrated in FIG. 6D. The photoresist section 617 can be formed using any known photoresist patterning and etching technique. The pattern of the photoresist section 617 can be based on the particular pattern selected for the protection region 16 as discussed above in connection with FIG. 3. For example, the patterned photoresist section 617 can be formed over the predetermined areas 14b (FIG. 3) in the substrate 14 corresponding to the location of the photosensors 22 and prevent the dopant from penetrating into such predetermined areas. The selected removed portions 619 can be formed over the selected areas 14a (FIG. 3) in the substrate that correspond to the protection regions 16. In an alternative embodiment (not shown), with proper cleaning techniques, the patterned photoresist section 617 can be applied directly to the p-epitaxial section 614 without the use of the oxide section 615.

Figure 6E:
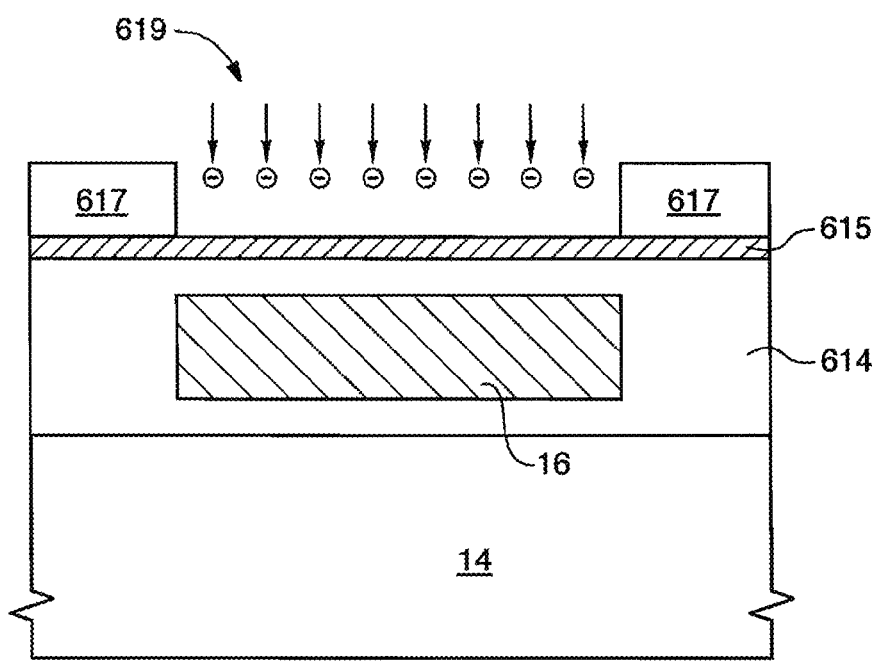

The formation of the protection region 16 begins with an n− type well or tub implant in the p-epitaxial section 614 as shown in FIG. 6E. The n-well 16 can be formed by, for example, implanting a dopant into p-eptiaxial section 614. The n-well can be doped with any suitable dopant material containing, for example, one or more of phosphorous or arsenic. In one embodiment, the dopant is arsenic. Various dopant concentrations, such as n+, n or n− concentration, can be used to form the n-well. For example, an n+ protection region 16 can have a dopant concentration in the range of $1 \times 10^{10}$ ions/cm$^2$ to about $1 \times 10^{18}$ ions/cm$^2$, or from about $1 \times 10^{13}$ ions/cm$^2$ to about $1 \times 10^{15}$ ions/cm$^2$. The n+ doped region can be doped by ion implantation at a power of about 15 Kev to about 50 Mev. It should be understood that the dopant concentration and power will vary depending upon a variety of physical parameters such as the material being implanted, the processing stage of the semiconductor substrate, the amount of material to be removed and/or other factors.

Figure 6F:
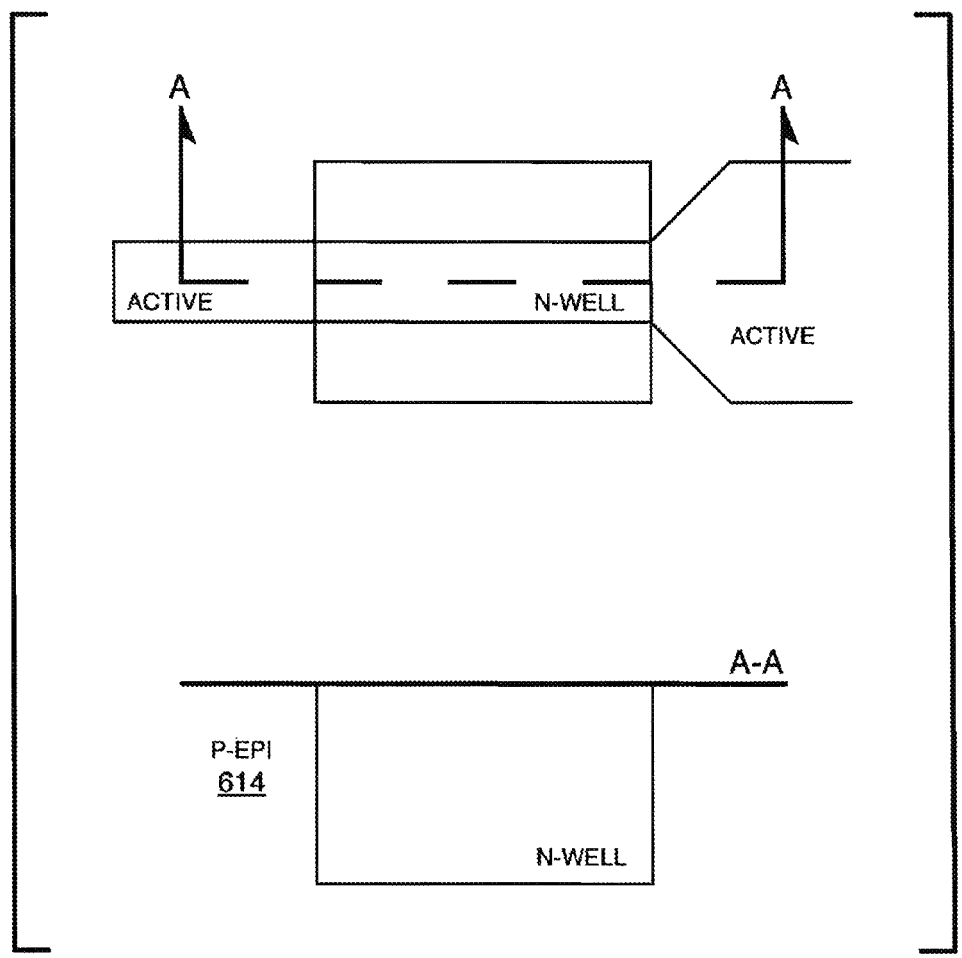

The n-well formed in FIG. 6E is illustrated in top and cross-sectional views in FIG. 6F. In addition, the active areas of the gates for the pixel (e.g., pixel 115A) are also illustrated.

Figure 6G:
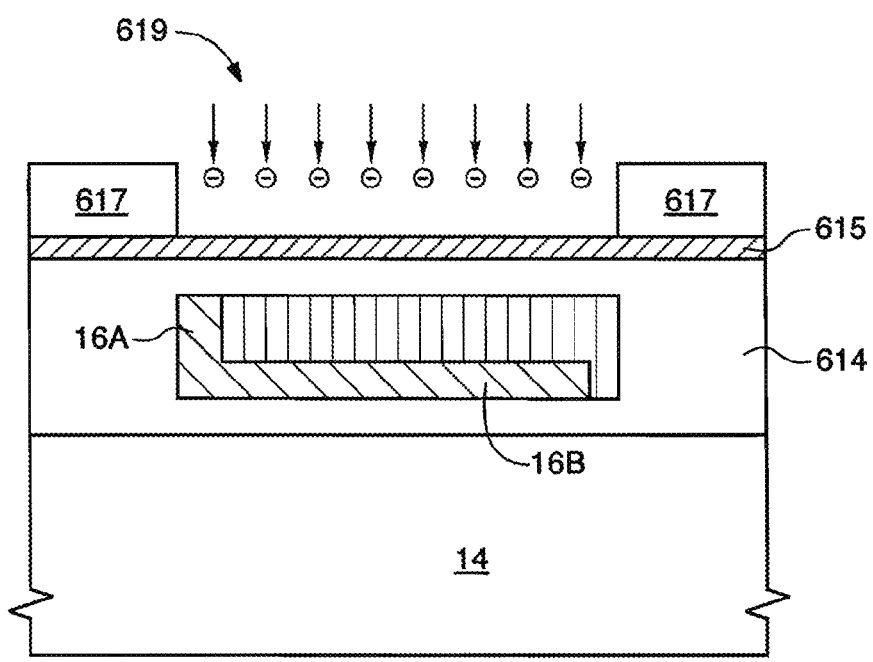
Figure 6H:
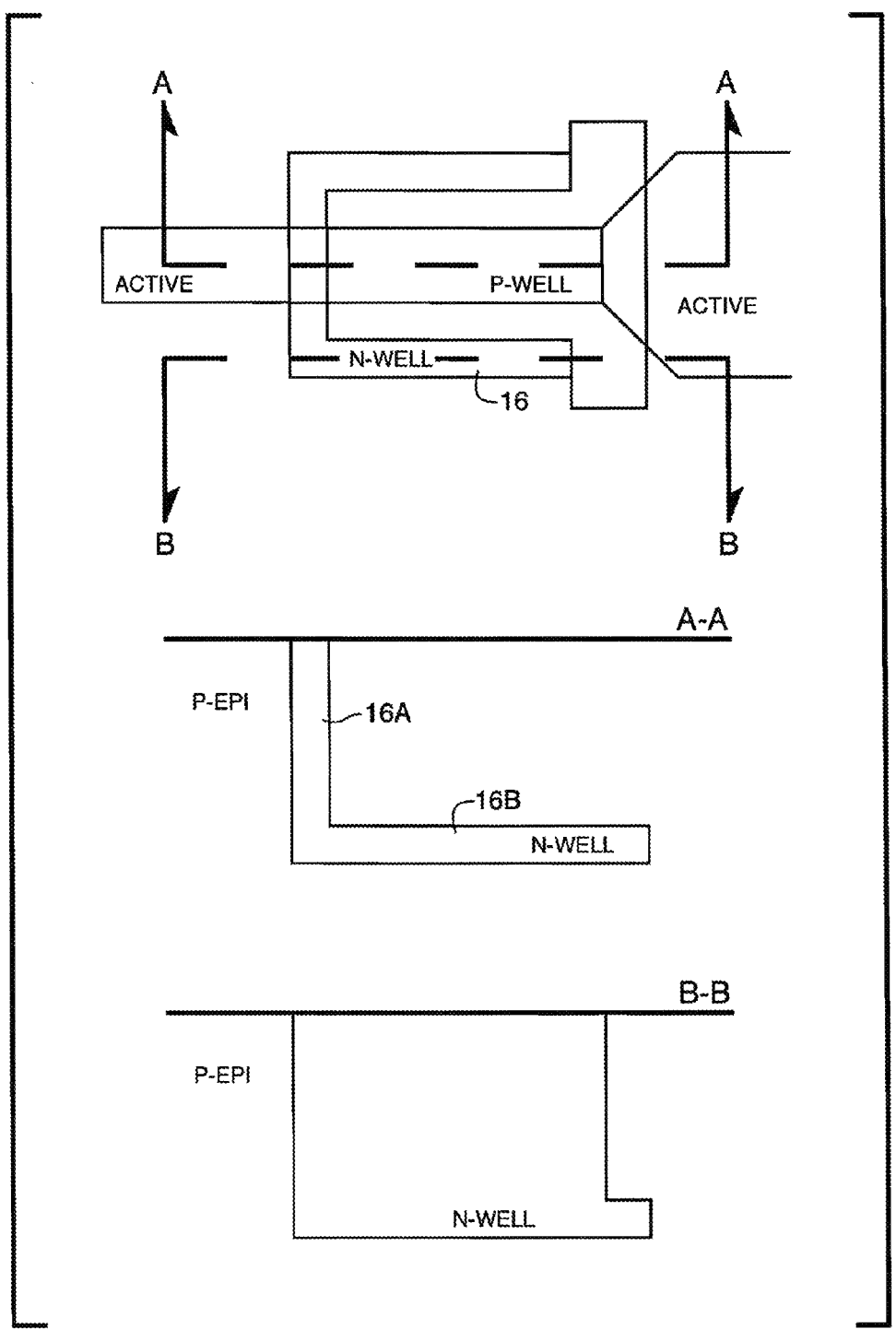

The formation of the protection region 16 continues with the addition of a p-well region located within the n-well region as shown in FIGS. 6G-H. The photoresist 617 is formed so as to expose an inner portion of the n-well while retaining a vertical wall 16a and lateral region 16b that intersects with the vertical wall 16a as illustrated in FIG. 6G. In one embodiment, the vertical wall 16a can be about 0.5 μm wide to 1.5 μm and extends to about 2.0 μm to about 2.5 deep while the lateral region 16b is about 0.5 μm to about 1.5 μm wide in a vertical direction and about 2.0 μm to about 2.5 μm deep.

The p-well can be formed to have a doping concentration that when combined with the existing doping concentration of the n-well creates a new doping that is intrinsic or close to the doping concentration of the p-epitaxial section 14. The p-well can be formed such that the remaining n-well creates a cup-like structure that surrounds the floating diffusion region 24 on all sides except where the future transfer transistor 26 and photodiode 22 are to be formed as shown in top and cross-sectional views of FIG. 6H. The p-well and the opening it creates in the n-well provide a relatively strong connection to the substrate 14 and assists in keeping the potential under the transfer transistor 26 and reset transistor 34 at or near the potential of the substrate 14.

The p-well can be doped with any suitable dopant material containing, for example, one or more of phosphorous, arsenic borondifluoride, or boron. In one embodiment, the dopant is arsenic boron. Various dopant concentrations can be used to form the p-well. For example, the formed p-well can have a dopant concentration in the range of $1 \times 10^{11}$ ions/cm$^2$ to about $1 \times 10^{14}$ ions/cm$^2$, $1 \times 10^{10}$ ions/cm$^2$ to about $1 \times 10^{18}$ ions/cm$^2$, or from about $1 \times 10^{13}$ ions/cm$^2$ to about $1 \times 10^{15}$ ions/cm$^2$. The p-well can be doped by using multiple ion implantations at a power of about 15 Kev to about 50 Mev.

Figure 6I:
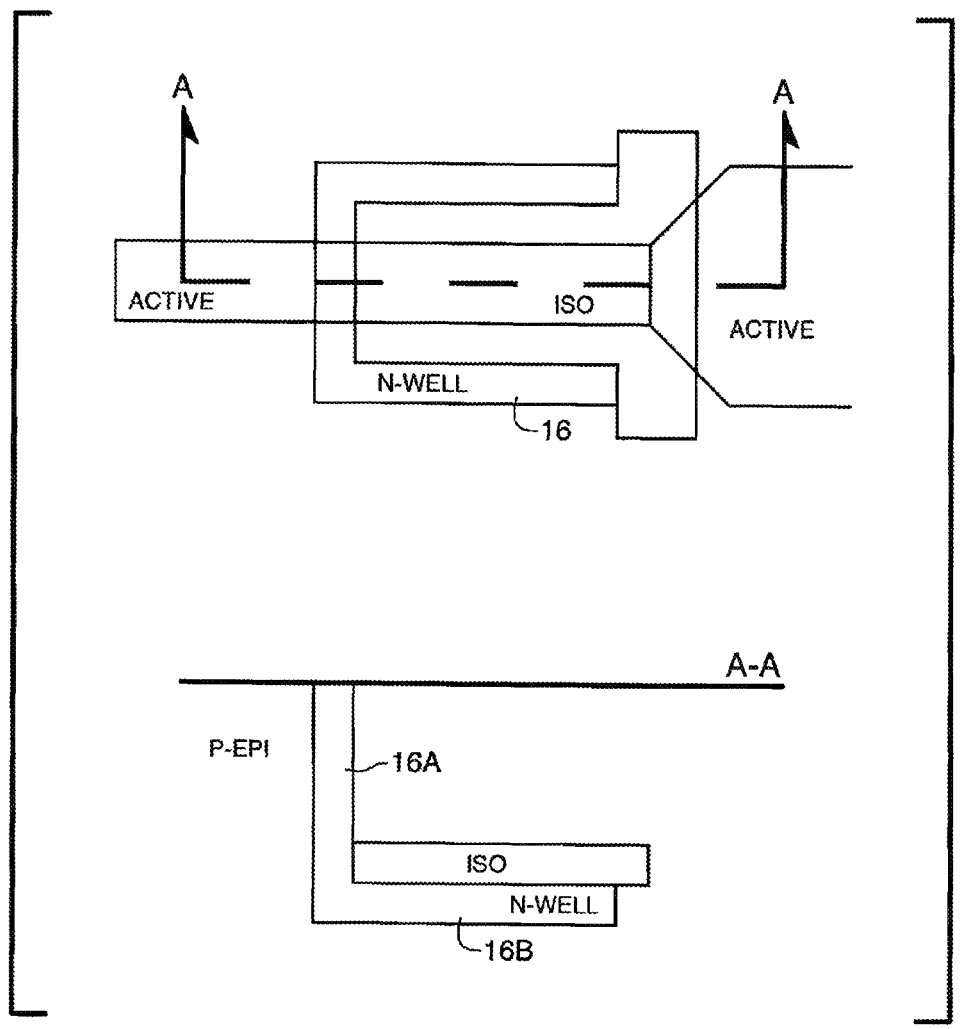

In one embodiment, the protection region 16 includes an isolation region (ISO) formed over the n-well as shown in the top and cross-sectional views of FIG. 6I. The isolation region can be formed using the same mask from the prior p-well formation. The isolation region can be formed using Borondifluoride or boron. In one embodiment, the dopant can be boron and can have a concentration in the range of about $1 \times 10^{12}$ ions/cm$^2$ to about $1 \times 10^{14}$ ions/cm$^2$. In this embodiment, the isolation region can be about 2 μm to about 2.5 μm from the surface. The isolation section further isolates the floating diffusion region 22 and gates, residing above the protection region 16, from the effects of the n-well.

Figure 6J:
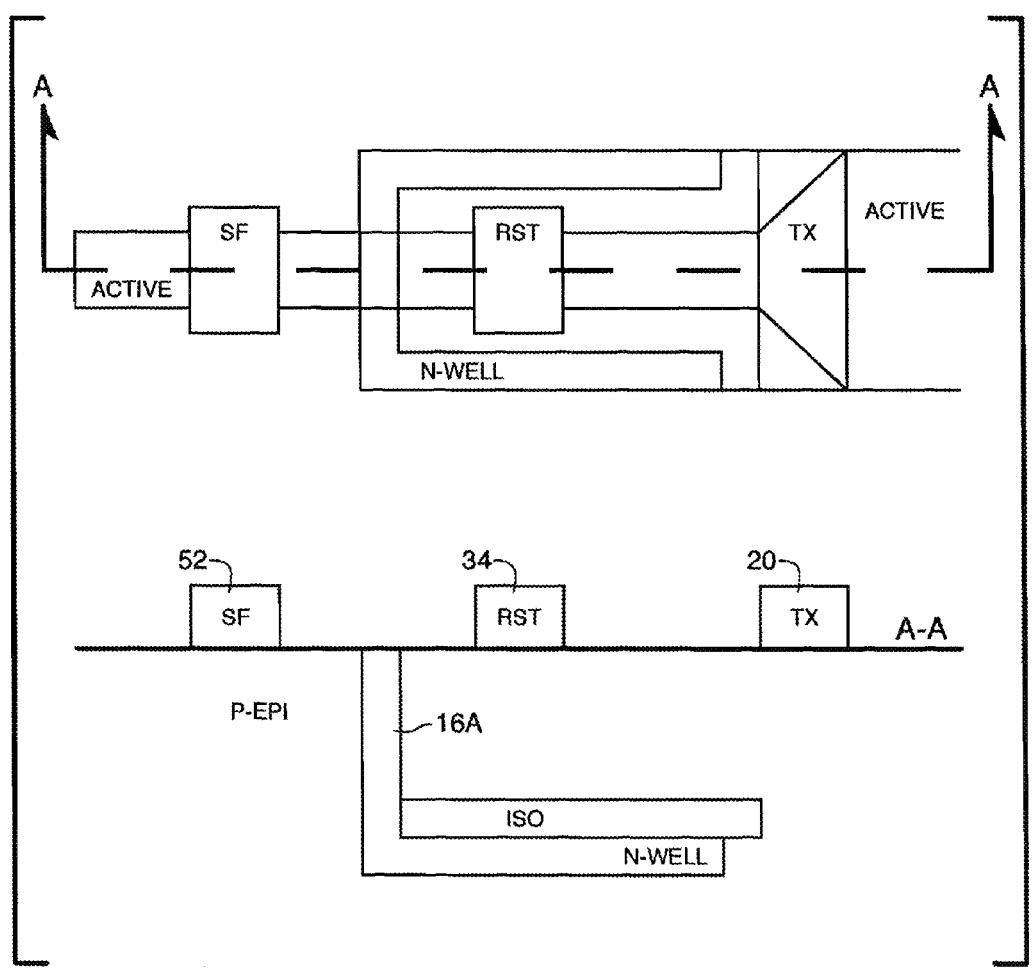

The formation and location of the polysilicon material for the source follower 52, reset 34 and transfer 20 gates can be formed as shown in the embodiment of FIG. 6J using known techniques. The transfer gate 20 is placed at the open end of the protection region 16 at a distance sufficient to prevent shorting. The reset gate 34 is placed within the boundaries of the protection region 16 at a distance sufficient to prevent shorting to the protection region 16 and transfer gate 20. The source follower gate 52 is placed outside the protection region 16.

Figure 6K:
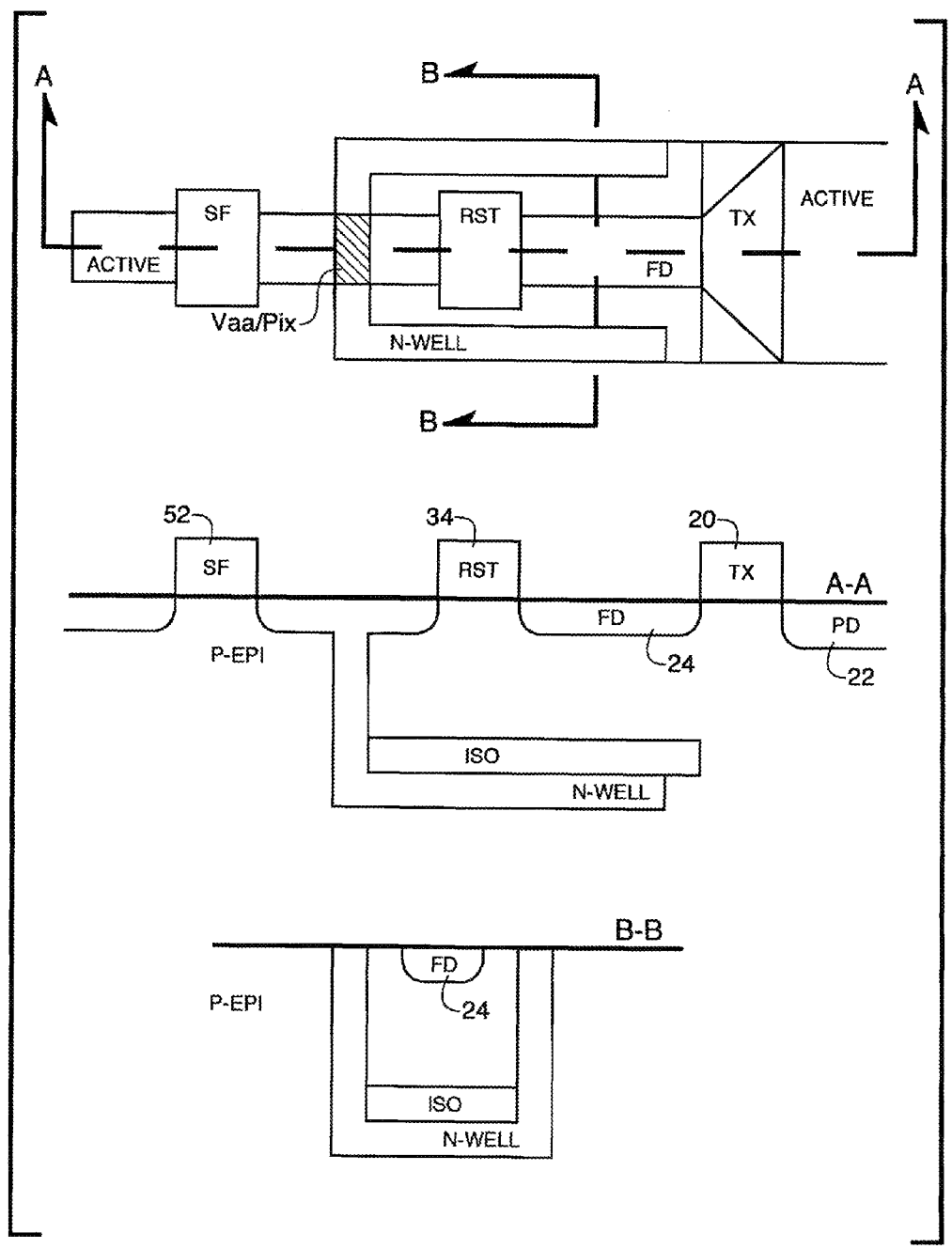

The formation and location of the source and drain regions of the transfer 20, reset 34 and source follower 52 transistors, and connections to VaaPix, and PR control unit 300 are shown in the embodiment of top and cross-sectional views of FIG. 6K. The source and drain regions are formed using well known techniques. Cross section A-A illustrates the location of the protection region 16 in relation to the SF, RST, and TX gates, PR contact, FD, and PD regions. Cross-section B-B illustrates that the floating diffusion region 22 is surrounded by the protection region 16 on all sides with the exception of the opening towards the transfer transistor 20.

FIGS. 7A-D represents an alternative embodiment where the potential of the protection region 16 is left floating (i.e., not physically connected to a voltage source or PR control unit 300). The fabrication of the alternative embodiment is similar to that previously described in connection with FIGS. 6A-E.

Figure 7A:
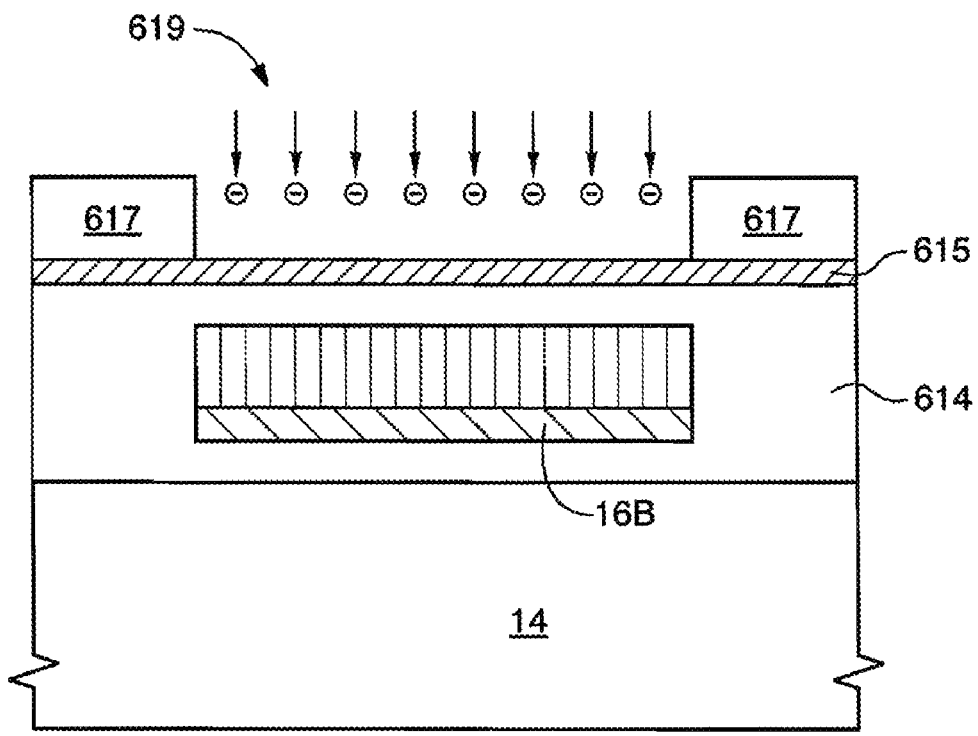
FIGS. 7A-E represents diagrams of an alternative embodiment for the fabrication of a protection region.
Figure 7B:
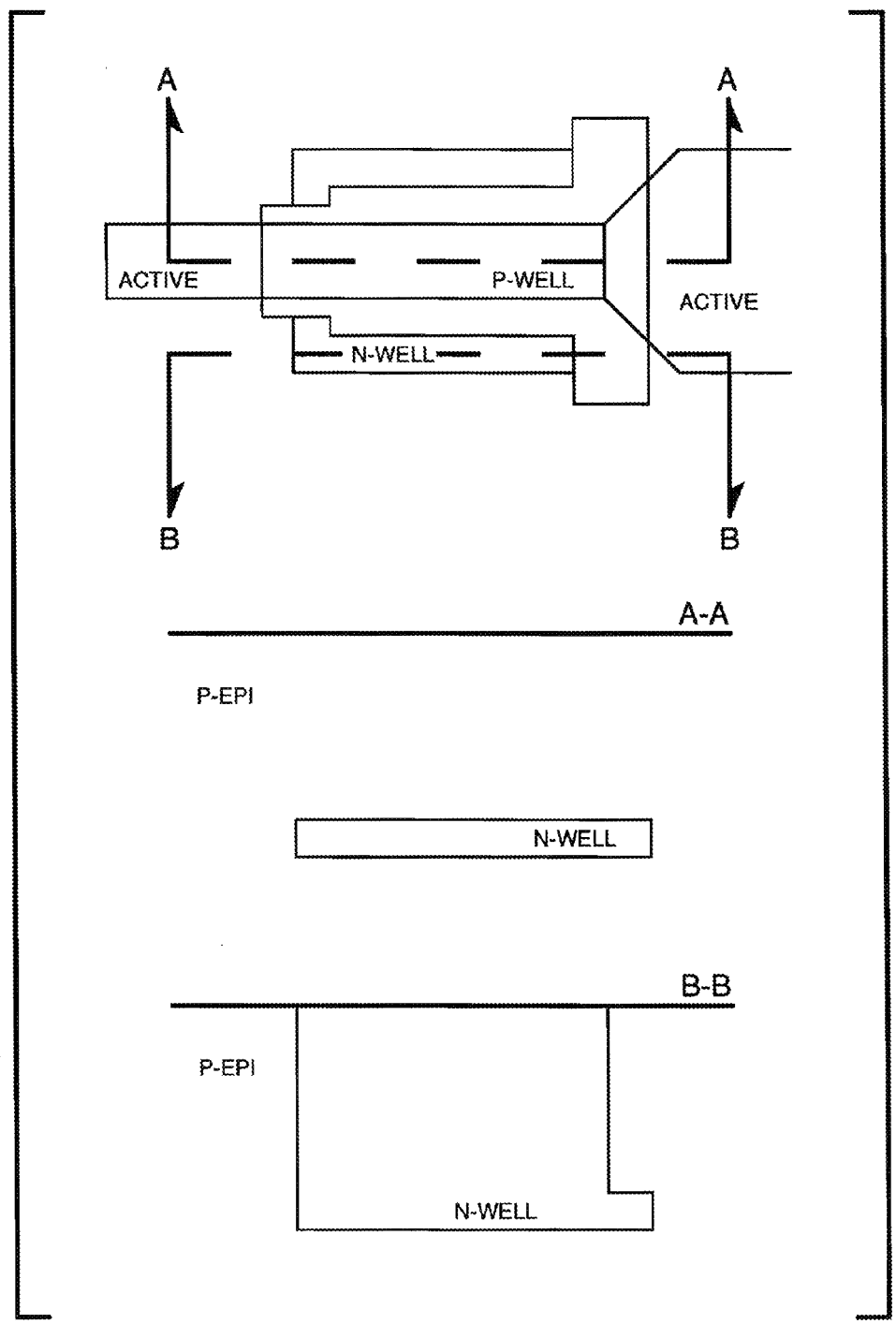

After the formation of the n-well (FIG. 6E), the formation of the protection region 16 continues with the addition of a p-well region located within the n-well region as shown in FIGS. 7A-E. The photoresist 617 is formed so as to expose an upper region of the n-well while retaining a lateral region as shown in FIG. 7A. In one embodiment, the lateral region can be about 0.5 μm wide to about 1 um in vertical direction and about 2.0 μm to about 2.5 μm deep. The p-well is formed to have a doping concentration that when combined with the existing doping concentration of the n-well creates a new doping that is intrinsic or close to the doping concentration of the p-epitaxial section 114. The p-well is formed such that the remaining n-well creates a trench that surrounds the floating diffusion region 24 on two sides leaving the area open where the future transfer transistor 26 and photodiode 22 are to be formed as shown in the top and cross sectional views of FIG. 7B. The p-well and the opening it creates in the n-well provide a relatively strong connection to the substrate 14 and assists in keeping the potential under the transfer transistor 26 and reset transistor 34 at or near the potential of the substrate 14.

The p-well can be doped with any suitable dopant material containing, for example, one or more of borondifluoride or boron. In one embodiment, the dopant can be boron. Various dopant concentrations can be used to form the p-well. For example, the formed p-well can have a dopant concentration in the range of about $1 \times 10^{11}$ ions/cm$^2$ to about $1 \times 10^{14}$ ions/cm$^2$ using multiple ion implantations at a power of about 15 Kev to about 1 Mev.

Figure 7C:
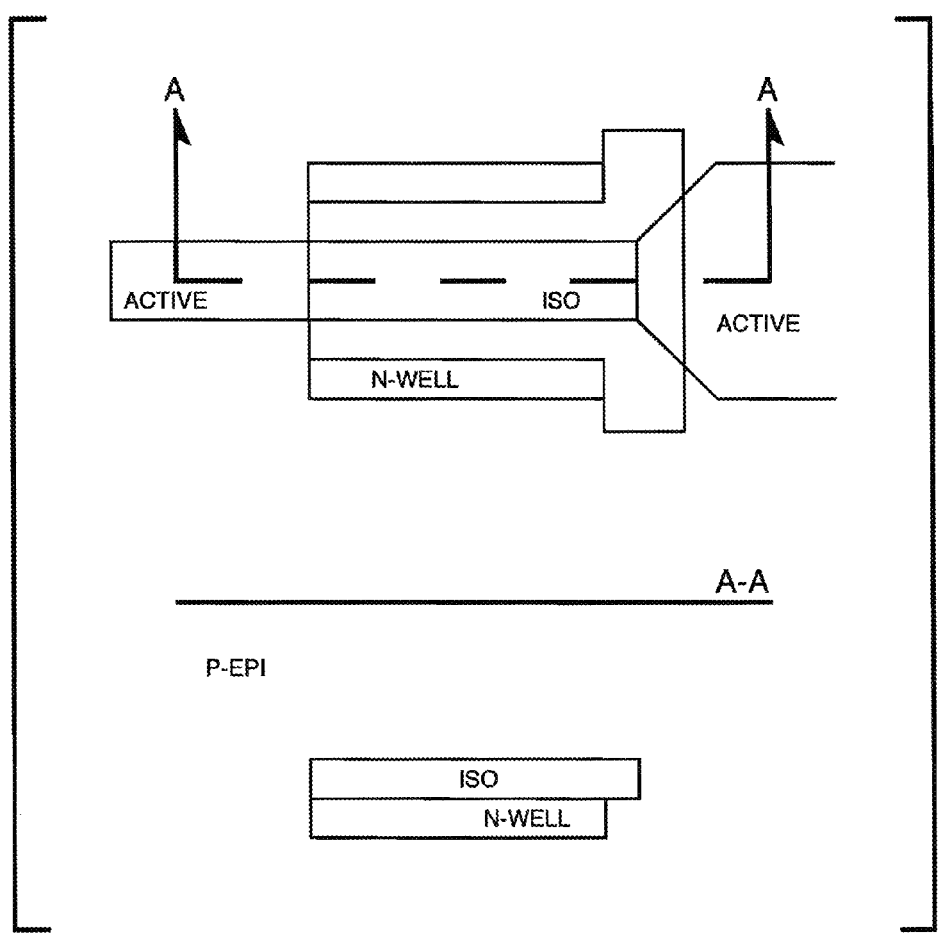

In one embodiment, the protection region 16 includes an isolation region (ISO) formed over the n-well as shown in FIG. 7C. The isolation region can be formed using the same mask from the prior p-well formation. The isolation region can be formed using Borondifluoride or boron. In one embodiment, the dopant can be boron with a concentration that can be in the range of about $1 \times 10^{12}$ ions/cm$^2$ to about $1 \times 10^{14}$ ions/cm$^2$. The isolation region can be from about 2 μm to 2.5 μm deep from the surface. The isolation section further isolates the floating diffusion 22 and gates, residing above the protection region 16, from the effects of the n-well.

Figure 7D:
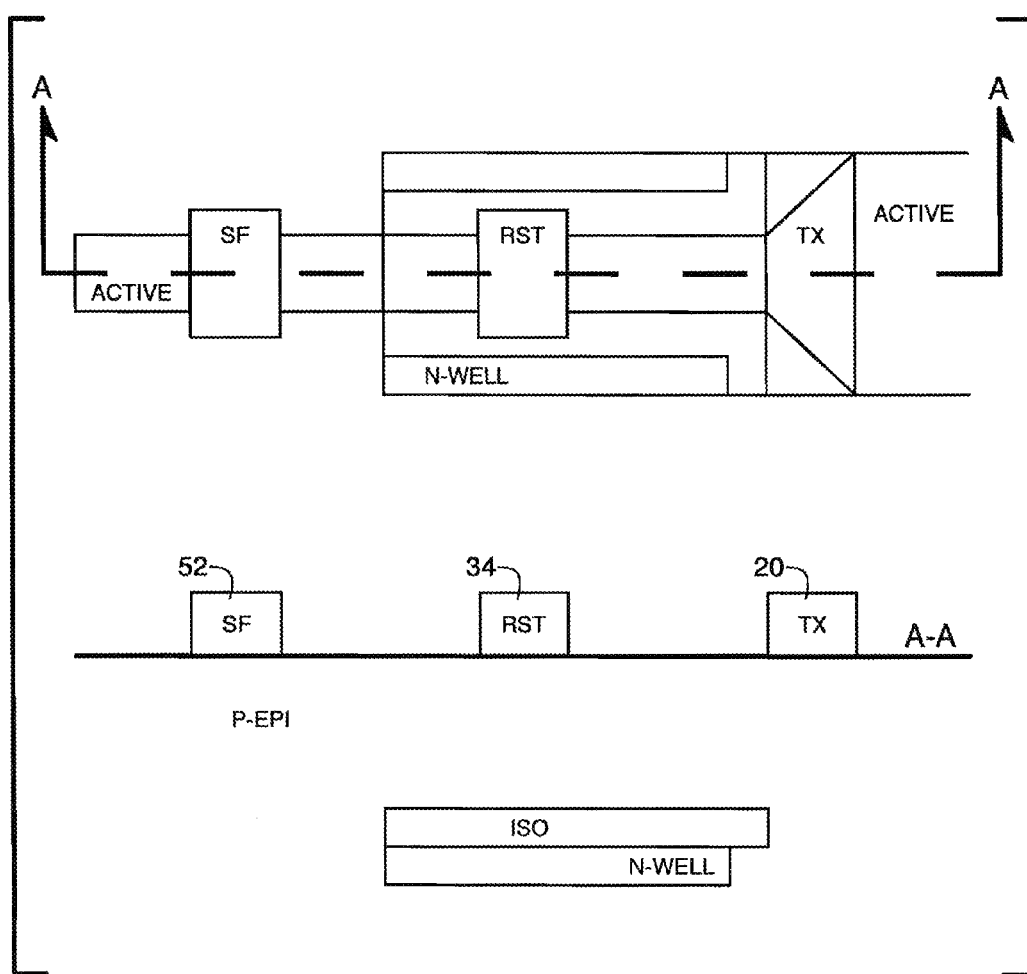

The formation and location of the polysilicon material for the source follower 52, reset 34 and transfer 20 gates can be as shown in the embodiment of FIG. 7D using known techniques. The transfer gate 20 is placed at one open end of the protection region 16 at a distance sufficient to prevent shorting. The reset gate 34 is placed within the boundaries of the protection region 16 at a distance sufficient to prevent shorting to the protection region 16 and transfer gate 20. The source follower gate 52 is placed outside the protection region 16.

Figure 7E:
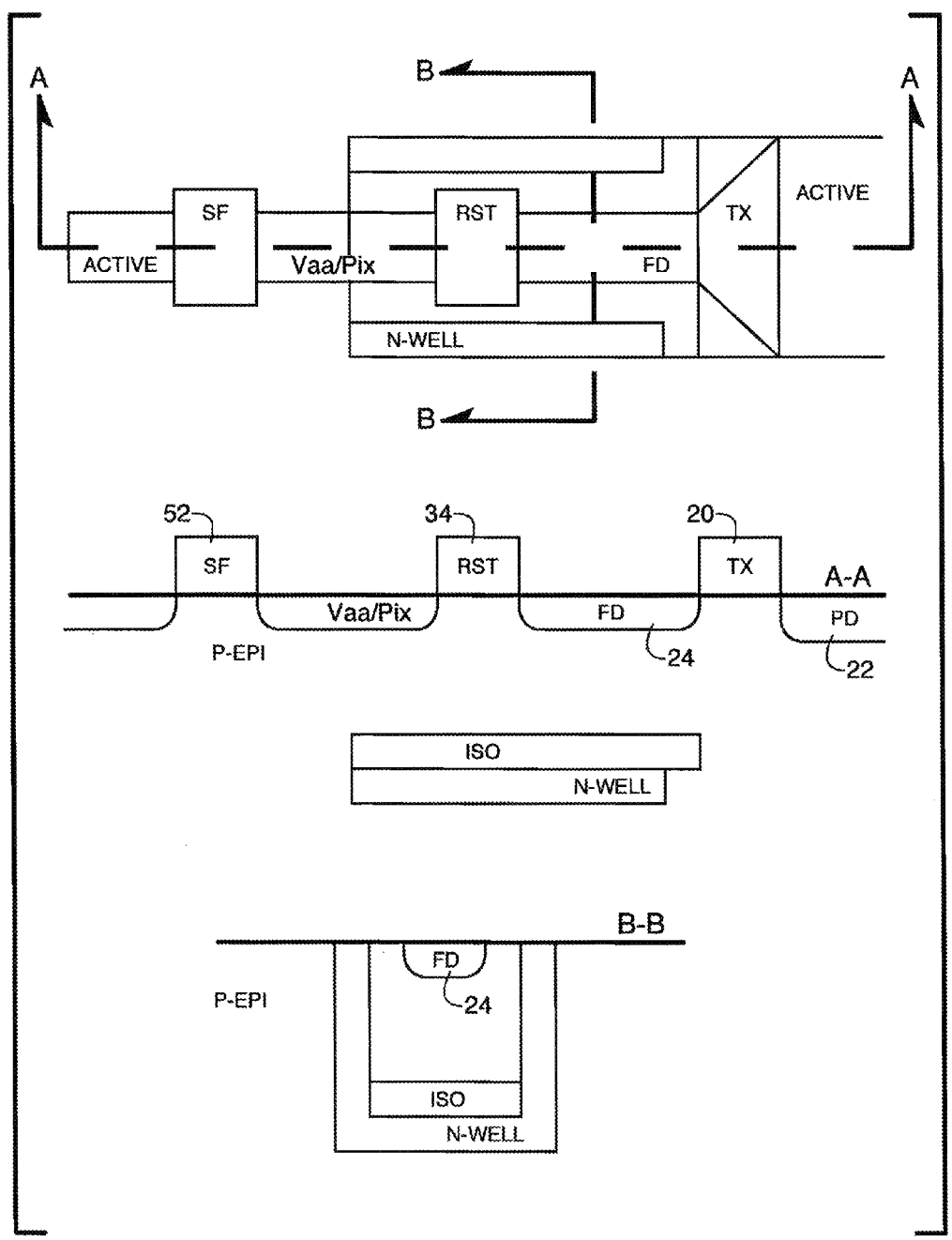

The formation and location of the source and drain regions of the transfer 20, reset 34 and source follower 52 transistors, and connection to VaaPix are shown in the embodiment of FIG. 7E. The source and drain regions are formed using well known techniques. Cross section A-A illustrates the location of the protection region 16 in relation to the SF, RST, and TX gates, FD, and PD regions. Cross-section B-B illustrates that the floating diffusion region 22 is surrounded by the protection region 16.

Various embodiments, in which the present invention can be practiced, have been illustrated and described above solely for the purpose of providing a convenient and enabling discussion of the applicability of the present invention to one or more specific applications. These embodiments are not, therefore, intended to limit the various additional embodiments or applications to which the present invention can be applied as defined in the claims and their equivalents.

What is claimed is:

1. A method of capturing an image using an image capturing device, the method comprising:
sensing electromagnetic radiation for a predetermined length of time using a photo-sensor, the photo-sensor generating charge in response to the sensed electromagnetic radiation;
storing the generated charge in a storage region; and
attracting charge, not generated from the photo-sensor, away from the storage region by changing a voltage potential of a protection region residing below the storage region, wherein the step of attracting charge includes:
attracting charge, not generated from the photo-sensor, away from the storage region by changing the voltage potential of the protection region during a first portion of the predetermined length of time and changing the voltage potential of the protection region again during a second portion of the predetermined length of time.

2. A method of capturing an image using an image capturing device, the method comprising:
sensing electromagnetic radiation for a predetermined length of time using a photo-sensor, the photo-sensor generating charge in response to the sensed electromagnetic radiation;
storing the generated charge in a storage region; and
attracting charge, not generated from the photo-sensor, away from the storage region by changing a voltage potential of a protection region residing below the storage region, wherein the step of attracting charge includes:
attracting charge, not generated from the photosensor, away from the storage region by changing the voltage potential of the protection region during at least three different portions of the predetermined length of time.

3. A method of capturing an image using an image capturing device, the method comprising:
sensing electromagnetic radiation for a predetermined length of time using a photo-sensor, the photo-sensor generating charge in response to the sensed electromagnetic radiation;
storing the generated charge in a storage region; and
attracting charge, not generated from the photo-sensor, away from the storage region by changing a voltage potential of a protection region residing below the storage region, wherein the step of attracting charge includes:
defining a first, second, and third portion of time from the predetermined length of time; and
changing the voltage potential of the protection region during the first, second, and third portions of time.

4. A method of capturing an image using an image capturing device, the method comprising:
sensing electromagnetic radiation for a predetermined length of time using a photo-sensor, the photo-sensor generating charge in response to the sensed electromagnetic radiation;
storing the generated charge in a storage region; and
attracting charge, not generated from the photo-sensor, away from the storage region by changing a voltage potential of a protection region residing below the storage region, wherein the step of attracting charge includes:
changing the voltage potential of the protection region at least twice during the predetermined length of time.

5. A method of capturing an image in an image capturing device, the method comprising:
generating charge, with a photo-sensor, in response to receiving light;
storing the generated charge in a storage region; and
protecting the storage region from storing charge generated by stray electrons with a protection region located below and partially around the storage region, wherein the step of generating charge includes the step of:
generating charge, with a photosensor, in response to receiving light for a receiving period of time, wherein the step of protecting includes:
dynamically altering the voltage potential of the protection region, wherein the step of dynamically altering includes:
dynamically altering the voltage potential of the protection region after a portion of the receiving period of time has expired.

* * * * *